United States Patent
Yang et al.

(10) Patent No.: US 10,164,656 B2
(45) Date of Patent: Dec. 25, 2018

(54) BIT FLIPPING ALGORITHM FOR PROVIDING SOFT INFORMATION DURING HARD DECISION HARD DECODING

(71) Applicant: Silicon Motion Inc., Hsinchu County (TW)

(72) Inventors: Tsung-Chieh Yang, Hsinchu (TW); Jian-Dong Du, Taoyuan (TW)

(73) Assignee: Silicon Motion Inc., Hsinchu County (TW)

( * ) Notice: Subject to any disclaimer, the term of this patent is extended or adjusted under 35 U.S.C. 154(b) by 19 days.

(21) Appl. No.: 15/086,006

(22) Filed: Mar. 30, 2016

(65) Prior Publication Data
US 2017/0288699 A1   Oct. 5, 2017

(51) Int. Cl.
| H03M 13/11 | (2006.01) |
| H03M 13/37 | (2006.01) |
| H03M 13/45 | (2006.01) |

(52) U.S. Cl.
CPC .... *H03M 13/1108* (2013.01); *H03M 13/1111* (2013.01); *H03M 13/1125* (2013.01); *H03M 13/1128* (2013.01); *H03M 13/3707* (2013.01); *H03M 13/3715* (2013.01); *H03M 13/45* (2013.01)

(58) Field of Classification Search
CPC ......... H03M 13/1108; H03M 13/1128; H03M 13/1125; H03M 13/1111; H03M 13/45
USPC ........................................................ 714/780
See application file for complete search history.

(56) References Cited

U.S. PATENT DOCUMENTS

| 7,783,952 B2* | 8/2010 | Nimbalker | H03M 13/114 |
| | | | 714/755 |
| 7,978,793 B2* | 7/2011 | Anekoji | H04L 1/0045 |
| | | | 375/340 |
| 8,051,363 B1* | 11/2011 | Liu | H03M 13/1117 |
| | | | 714/759 |
| 8,700,970 B2* | 4/2014 | Steiner | G06F 11/1012 |
| | | | 714/755 |
| 8,707,123 B2* | 4/2014 | Liu | G06F 5/015 |
| | | | 714/752 |
| 8,719,682 B2* | 5/2014 | Han | G11B 20/10046 |
| | | | 714/799 |
| 8,782,496 B2* | 7/2014 | Sakaue | G06F 11/1048 |
| | | | 714/773 |
| 8,867,601 B2* | 10/2014 | Beidas | H04L 1/0048 |
| | | | 375/144 |
| 9,021,332 B2* | 4/2015 | Haratsch | G06F 11/1012 |
| | | | 714/752 |
| 9,235,467 B2* | 1/2016 | Micheloni | G06F 11/1012 |
| 9,317,365 B2* | 4/2016 | Alhussien | G06F 11/1076 |
| 2011/0307765 A1 | 12/2011 | Kim | |
| 2013/0332790 A1* | 12/2013 | Lu | H03M 13/1111 |
| | | | 714/752 |

(Continued)

*Primary Examiner* — James C Kerveros
(74) *Attorney, Agent, or Firm* — Winston Hsu

(57) ABSTRACT

A method for using a first decoder operating in a hard decision hard decoding mode to generate soft information for a second decoder operating in a hard decision soft decoding mode includes: generating a look-up table (LUT) linking a number of failed check nodes to a log-likelihood ratio (LLR) value; in a first iteration of the first decoder, inputting the number of failed check nodes to the LUT table to generate an LLR value; and outputting the LLR value to the second decoder.

3 Claims, 2 Drawing Sheets

(56) References Cited

U.S. PATENT DOCUMENTS

2015/0200688 A1* 7/2015 Pan .................. H03M 13/3927
714/794
2015/0236726 A1* 8/2015 Sankaranarayanan .......................
H03M 13/1111
714/780

* cited by examiner

BIT FLIPPING ALGORITHM FOR PROVIDING SOFT INFORMATION DURING HARD DECISION HARD DECODING

BACKGROUND OF THE INVENTION

1. Field of the Invention

The present invention relates to a bit flipping algorithm for a low-density parity check (LDPC) decoder, and more particularly to a method for reducing the number of iterations performed by the bit flipping algorithm by providing soft information to a second decoder during hard decision hard decoding performed by a first decoder.

2. Description of the Prior Art

Low-density parity check (LDPC) decoders use a linear error correcting code with parity bits. Parity bits provide a decoder with parity equations which can validate a received codeword. For example, a low-density parity check is a fixed length binary code wherein all the symbols added together will equal zero.

During encoding, all data bits are repeated and transmitted to encoders, wherein each encoder generates a parity symbol. Codewords are formed of k information digits and r check digits. If the length of the codeword is n then the information digits, k, will equal n−r. The codewords can be represented by a parity check matrix, which consists of r rows (representing equations) and n columns (representing digits), and is represented in FIG. 1. The codes are called low-density because the parity matrix will have very few '1's in comparison to the number of '0's. During decoding, each parity check is viewed as a single parity check code, and is then cross-checked with others. Decoding occurs at check nodes, and cross-checking occurs at variable nodes.

LDPC engines support three modes: hard decision hard decoding, soft decision hard decoding, and soft decision soft decoding. FIG. 1 illustrates the parity check matrix H and a Tanner graph, which is another way of representing the codewords, and is used to explain the operation of the LDPC decoder for hard decision soft decoding when using a bit flipping algorithm.

The check nodes, which are represented by the square boxes, are the number of parity bits; and the variable nodes, which are represented by the circular boxes, are the number of bits in a codeword. If a code symbol is involved in a particular equation, a line is drawn between the corresponding check node and variable node. 'Messages', which are estimates, are passed along the connecting lines, and combined in different ways at the nodes. Initially, the variable nodes will send an estimate to the check nodes on all connecting lines containing a bit believed to be correct. Each check node then takes all the other connected estimates, makes new estimates for each variable node based on this information, and passes the new estimate back to the variable nodes. The new estimate is based on the fact that the parity check equations force all variable nodes connected to a particular check node to sum to zero.

The variable nodes receive the new information and use a majority rule (a hard decision) to determine if the value of the original bit they sent was correct. If not, the original bit will be 'flipped'. The bit is then sent back to the check nodes, and these steps are repeated for a predetermined number of iterations or until the parity check equations at the check nodes are satisfied. If these equations are satisfied (i.e. the value calculated by the check nodes matches the value received from the variable nodes) then Early Termination can be activated, which allows the system to exit the decoding process before the maximum number of iterations is reached.

If the first decoding mode cannot resolve the codeword before a maximum number of iterations is reached, the decoding mode should change. As hard decision hard decoding is the most power efficient mode, the general order is hard decision hard decoding→hard decision soft decoding→soft decision soft decoding. The latter two modes require some soft information which is based on the concept of belief propagation. Each message received at the nodes is a conditional probability that the bit received is a 0 or a 1. Probabilities which are known in advance before running the LDPC decoder are called a priori probabilities, but the soft decoding scheme also requires a posteriori probabilities, which can only be known after running the decoder through a certain number of iterations. Therefore, when switching from a hard decision hard decoding scheme to a hard decision soft decoding scheme, the LDPC decoder must perform a certain number of iterations before the a posteriori probabilities can be calculated.

SUMMARY OF THE INVENTION

It is an objective of the present invention to decrease the number of iterations using a bit flipping algorithm when switching from a first decoding scheme to a second decoding scheme.

A method for using a first decoder operating in a hard decision hard decoding mode to generate soft information for a second decoder operating in a hard decision soft decoding mode according to an exemplary embodiment of the present invention comprises: generating a look-up table (LUT) linking a number of failed check nodes to a log-likelihood ratio (LLR) value; in a first iteration of the first decoder, inputting the number of failed check nodes to the LUT table to generate an LLR value; and outputting the LLR value to the second decoder.

These and other objectives of the present invention will no doubt become obvious to those of ordinary skill in the art after reading the following detailed description of the preferred embodiment that is illustrated in the various figures and drawings.

DETAILED DESCRIPTION

As detailed in the background, soft information is information relating to how reliable a codeword at the variable node is. One example of soft information is a log-likelihood ratio (LLR) value, which is used by the variable nodes in hard decision soft decoding and soft decision soft decoding. The LLR values are determined by a posteriori probabilities and are related to how many check nodes fail (i.e. how reliable the codeword at the variable node is) as well as a number of error bits in the system. An illustration of the relationship between failed check nodes, error bits and LLR values is provided in Table 1 and Table 2 below.

TABLE 1

| | posterior probabilities | | | | | | |
|---|---|---|---|---|---|---|---|
| | Error # | | | | | | |
| Failed Check Node | 5 | 15 | 25 | 35 | 45 | 55 | 65 |
| 0 | 0 | 0 | 0 | 0 | 0 | 0.00001 | 0.00002 |
| 1 | 0 | 0 | 0 | 0.00001 | 0.00005 | 0.00011 | 0.00022 |
| 2 | 0 | 0.00009 | 0.0003 | 0.00044 | 0.00106 | 0.00157 | 0.0022 |
| 3 | 0.02391 | 0.02092 | 0.0211 | 0.02108 | 0.02114 | 0.02132 | 0.02151 |
| 4 | 0.992 | 0.93359 | 0.60861 | 0.51252 | 0.31132 | 0.23141 | 0.18 |
| 5 | 1 | 0.9999 | 0.99157 | 0.9803 | 0.90399 | 0.80908 | 0.68508 |

TABLE 2

| | LLR values | | | | | | | | |
|---|---|---|---|---|---|---|---|---|---|
| Failed Check | Error # | | | | | | | | |
| Node | 5 | 15 | 25 | 35 | 45 | 55 | 65 | Fix 1 | Fix |
| 0 | 63 | 63 | 63 | 63 | 63 | 63 | 63 | 63 | 63 |
| 1 | 63 | 63 | 63 | 63 | 63 | 63 | 63 | 63 | 53 |
| 2 | 63 | 63 | 63 | 59 | 55 | 52 | 49 | 50 | 42 |
| 3 | 30 | 31 | 31 | 31 | 31 | 31 | 31 | 31 | 31 |
| 4 | −39 | −13 | −4 | 2 | 6 | 10 | 12 | 20 | 21 |
| 5 | −63 | −57 | −38 | −26 | −18 | −12 | −6 | 10 | 10 | wherein the LLR values are calculated as shown below.

$$LLR\_i = \text{Max } LLR * ((\text{column\_weight} + 1 - i)/\text{column\_weight} + 1)$$

In the above, the value i is the number of failed check nodes. Using Table 1 and Table 2, a look-up table (LUT) can be generated which directly links the number of failed check nodes to the LLR values. The look-up table is illustrated below as Table 3.

TABLE 3

| Fail Check Node | Log-likelihood Ratio (LLR) |
|---|---|
| 0 | 63 |
| 1 | 53 |
| 2 | 42 |
| 3 | 31 |
| 4 | 21 |
| 5 | 10 |

Therefore, even when the LDPC decoder is operating in hard decision hard decoding mode, soft information can be generated by using the LUT.

In an exemplary embodiment of the present invention, a first decoder using a bit flipping algorithm in hard decision hard decoding mode generates LLR values in a first iteration by determining the number of failed check nodes and inputting this information to the LUT to output an LLR value. The first decoder then passes the LLR values to an N2 decoder, which operates in a hard decision soft decoding mode.

Figure 1:
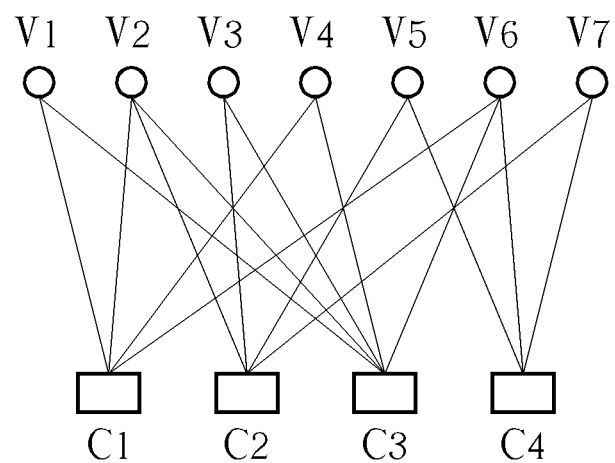
FIG. 1 illustrates a parity check matrix H and a Tanner graph.
Figure 2:
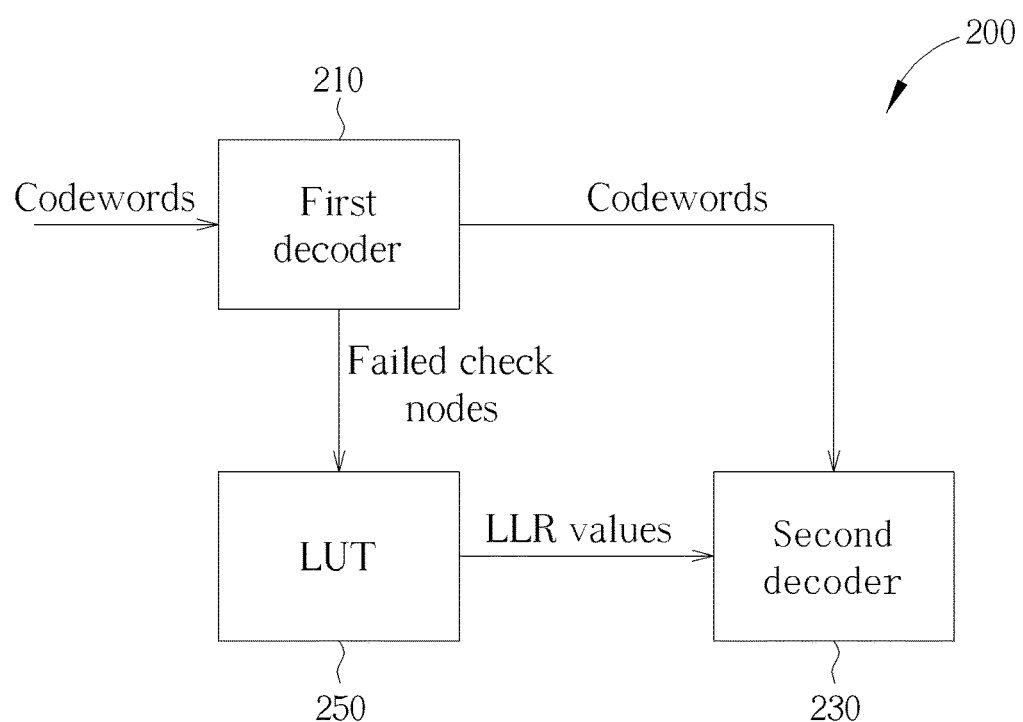
FIG. 2 illustrates a decoding system according to an exemplary embodiment of the present invention.

Please refer to FIG. 2, which illustrates the first decoder, the LUT and the N2 decoder. As shown in FIG. 2, a decoding system 200 comprises a first decoder 210, which is coupled to both an LUT 250 and a second (N2) decoder 230. Codewords are input to the first decoder 210. The first decoder 210 calculates the number of failed check nodes and these are passed to the LUT 250, which generates LLR values and passes the LLR values to the second decoder 230.

If the codeword is not resolved by the first decoder 210, the codeword will be passed directly to the second decoder 230.

Therefore, in the first iteration of the bit flipping decoder, information will also be provided for a soft decode as well as for the hard decode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing low-density parity check (LDPC) decoding, the method comprising:
    generating a look-up table (LUT) containing predetermined values linking a number of failed check nodes to a log-likelihood ratio (LLR) value;
    inputting a codeword to a first decoder which operates in a hard decoding mode;
    in a first iteration of the first decoder, decoding the codeword using a hard decoding algorithm to generate hard information by determining a number of failed check nodes and generating soft information by inputting the number of failed check nodes to the LUT to generate an LLR value;
    performing a successive number of decoding iterations of the codeword in the first decoder using the hard decoding algorithm wherein in each iteration a number of failed check nodes is determined, and the number of failed check nodes is input to the LUT to generate an LLR value;
    when a predetermined number of decoding iterations of the hard decoding algorithm is reached without parity check equations for the codeword being satisfied at check nodes, stopping decoding of the codeword using the first decoder, inputting the codeword to the second decoder and starting decoding of the codeword in the second decoder using a soft decoding algorithm and the LLR values generated by the LUT; or
    when parity check equations for the codeword are satisfied at the check nodes before the predetermined number of decoding iterations of the hard decoding algorithm is reached, the decoded codeword is directly output without the second decoder being used.

2. The method of claim 1, wherein the first decoder and the second decoder both utilize a bit flipping algorithm for decoding.

3. The method of claim 1, wherein the LUT is generated utilizing the equation LLR_i=Max LLR*((column_weight+1−i)/column_weight+1), wherein i is a number of failed check nodes.

* * * * *